US011619877B2

(12) United States Patent
Bonam et al.

(10) Patent No.: US 11,619,877 B2
(45) Date of Patent: *Apr. 4, 2023

(54) DETERMINATION OF OPTICAL ROUGHNESS IN EUV STRUCTURES

(71) Applicant: International Business Machines Corporation, Armonk, NY (US)

(72) Inventors: Ravi K. Bonam, Albany, NY (US); Gangadhara Raja Muthinti, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/814,249

(22) Filed: Jul. 22, 2022

(65) Prior Publication Data

US 2022/0357648 A1 Nov. 10, 2022

Related U.S. Application Data

(63) Continuation of application No. 16/361,843, filed on Mar. 22, 2019, now Pat. No. 11,480,868.

(51) Int. Cl.
*G03F 1/36* (2012.01)
*G03F 7/20* (2006.01)
(Continued)

(52) U.S. Cl.
CPC .............. *G03F 1/36* (2013.01); *G01B 11/02* (2013.01); *G03F 7/2004* (2013.01); *H01L 22/12* (2013.01)

(58) Field of Classification Search
None
See application file for complete search history.

(56) References Cited

U.S. PATENT DOCUMENTS

| 4,511,800 A | 4/1985 | Harbeke et al. |
| 5,034,611 A | 7/1991 | Alpern et al. |

(Continued)

FOREIGN PATENT DOCUMENTS

KR 20110110578 A 10/2011

OTHER PUBLICATIONS

Bonam R. et al., "An OCD perspective of line edge and line width roughness metrology", Proceedings of SPIE, vol. 10145, 1014511; 2017; 12 pages.

(Continued)

*Primary Examiner* — Lina M Cordero
(74) *Attorney, Agent, or Firm* — Cantor Colburn LLP; Joseph P. Curcuru

(57) ABSTRACT

A computer-implemented method for determining optical roughness in a semiconductor pattern structure that includes receiving, using a processor, optical responses spectra collected from the semiconductor pattern structure and constructing, using the processor optical critical dimension (OCD) models by using a set of input parameters for each layer of the semiconductor pattern structure. The method further includes calculating, using the processor, theoretical optical responses from a theoretical input generated by the OCD models. In addition, the method provides for comparing, using the processor, the optical responses spectra of the semiconductor pattern structure to the theoretical optical responses to determine output parameters for the optical roughness of the semiconductor pattern structure.

20 Claims, 5 Drawing Sheets

(51) Int. Cl.
   *G01B 11/02* (2006.01)
   *H01L 21/66* (2006.01)

(56) References Cited

U.S. PATENT DOCUMENTS

| | | | |
|---|---|---|---|
| 5,838,445 | A | 11/1998 | Sandhu et al. |
| 7,046,375 | B2 | 5/2006 | Bischoff et al. |
| 7,065,423 | B2 | 6/2006 | Prager et al. |
| 7,330,279 | B2 | 2/2008 | Vuong et al. |
| 8,024,675 | B1 | 9/2011 | Gupta et al. |
| 8,050,900 | B2 | 11/2011 | Mitrovic et al. |
| 8,791,951 | B2 | 7/2014 | Lee et al. |
| 9,459,536 | B1 * | 10/2016 | Lai .......................... C07C 69/63 |
| 2004/0023995 | A1 | 2/2004 | McKennon et al. |
| 2004/0218192 | A1 | 11/2004 | Bischoff et al. |
| 2011/0037988 | A1 * | 2/2011 | Brill .................. G03F 7/70616 356/600 |
| 2011/0069312 | A1 | 3/2011 | Kandel et al. |
| 2011/0098992 | A1 | 4/2011 | Van Beurden et al. |
| 2011/0148898 | A1 | 6/2011 | Lee |
| 2013/0024823 | A1 | 1/2013 | Tsai et al. |
| 2013/0050700 | A1 | 2/2013 | Osten et al. |
| 2013/0066597 | A1 | 3/2013 | Van Beurden |
| 2014/0222380 | A1 | 8/2014 | Kuznetsov et al. |
| 2016/0171748 | A1 | 6/2016 | Kohlbrenner et al. |
| 2017/0315447 | A1 * | 11/2017 | Liu .......................... G03F 7/325 |
| 2018/0188658 | A1 | 7/2018 | Van Der Post |
| 2018/0293721 | A1 | 10/2018 | Gupta et al. |
| 2019/0317410 | A1 | 10/2019 | Hansen |
| 2020/0249576 | A1 | 8/2020 | Warnaar et al. |
| 2020/0301268 | A1 | 9/2020 | Bonam et al. |

OTHER PUBLICATIONS

H. Gross et al., "Modelling line edge roughness in periodic line-space structures by Fourier optics to improve scatterometry", Journal of the European Optical Society—Rapid Publications. vol. 9, 2014. 10 pages.

List of IBM Patents or Patent Applications Treated as Related; Date Filed:Jul. 22, 2022, 2 pages.

* cited by examiner

LER Roughness

LWR Roughness

No Roughness

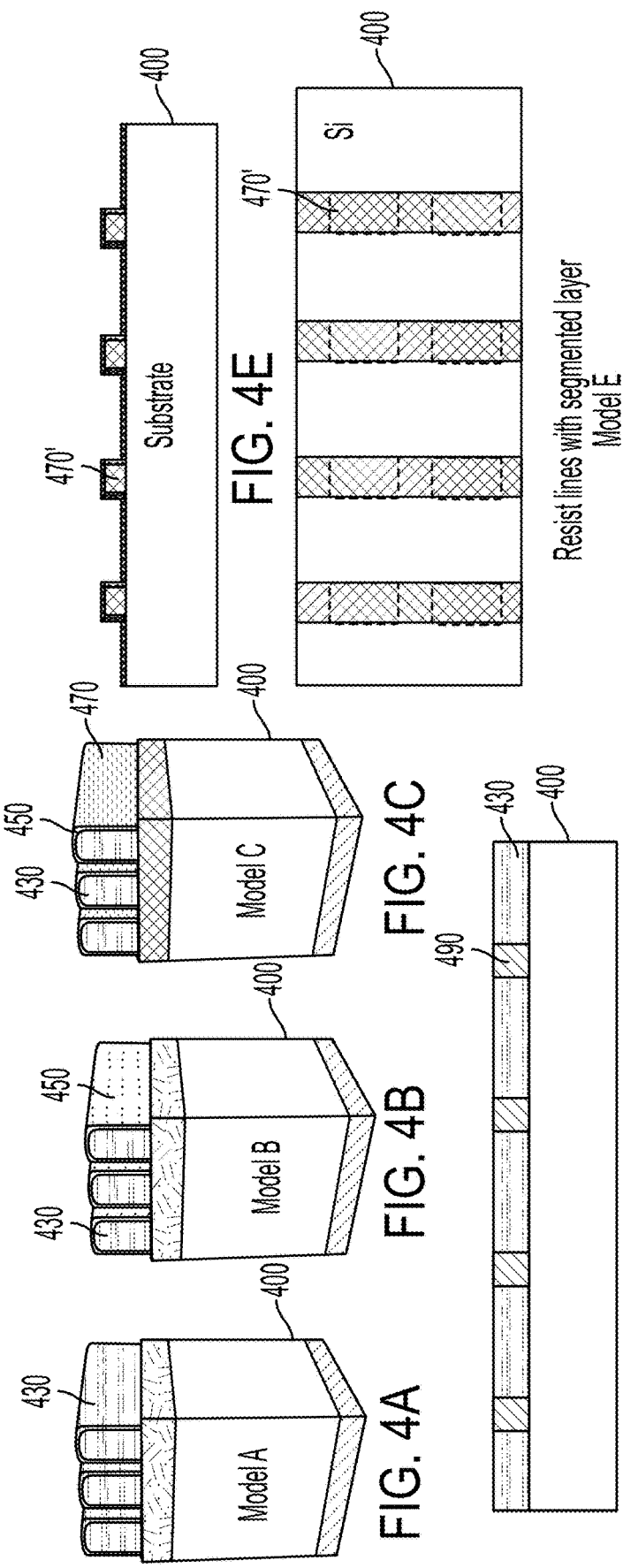

DETERMINATION OF OPTICAL ROUGHNESS IN EUV STRUCTURES

BACKGROUND

The present invention generally relates to semiconductor integrated circuits, and more particularly, to methods for determining line edge and line width roughness with optical metrology in semiconductor pattern structures formed using an extreme ultraviolet (EUV) light sensitive structure.

It has been shown that the line width roughness (LWR) and line edge roughness (LER) of the features of a device have an impact on the device performance. Variations of edges and widths on semiconductor patterns from lithographic processes are commonly due to mask process variations, shot noise effects, stochastics associated with photoresists, and the like. As the critical dimensions (CD) of devices continue to shrink for enablement of 7 nanometers technology node and below, control and monitoring of LWR and LER become increasingly more critical.

SUMMARY

According to non-limiting embodiments of the present invention a computer-implemented method for determining optical roughness in a semiconductor pattern structure is provided. The method includes receiving, using a processor, optical responses spectra collected from the semiconductor pattern structure by an optical metrology tool and constructing, using the processor, optical critical dimension (OCD) models by using a set of input parameters for each layer of the semiconductor pattern structure. The method further includes calculating, using the processor, theoretical optical responses from a theoretical input generated by the OCD models. In addition, the method provides for comparing, using the processor, the optical responses spectra of the semiconductor pattern structure to the theoretical optical responses to determine output parameters for the optical roughness of the semiconductor pattern structure.

Embodiments of the present invention are further directed to a computer-implemented method for determining a line edge roughness (LER) and a line width roughness (LWR) in a semiconductor pattern structure. The method includes receiving, using a processor, optical responses spectra collected from the semiconductor pattern structure by an optical metrology tool and constructing, using the processor, optical critical dimension (OCD) models with a virtual material (VM), wherein the VM represents LER and/or LWR. The method also includes calculating, using the processor, theoretical optical responses from a theoretical input generated by the OCD models with the VM. In addition, the method provides for comparing, using the processor, of the optical responses spectra of the semiconductor pattern structure to the theoretical optical responses to determine output parameters for the LER and LWR of the semiconductor pattern structure.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter that is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIG. 4A illustrates a 3D model of the semiconductor pattern structure generated by using a set of input parameters according to embodiments of the present invention;

FIG. 4B illustrates a 3D model of the semiconductor pattern structure generated by using a set of input parameters according to embodiments of the present invention;

FIG. 4C illustrates a 3D model of the semiconductor pattern structure generated by using a set of input parameters according to embodiments of the present invention;

FIG. 4D illustrates a 3D model of the semiconductor pattern structure generated by using a set of input parameters according to embodiments of the present invention;

FIG. 4E illustrates a side view of a 3D segmented LER and LWR model of the semiconductor pattern structure according to embodiments of the present invention;

FIG. 4F illustrates a top view of the 3D segmented LER and LWR model of the semiconductor pattern structure shown in FIG. 4E according to embodiments of the present invention;

DETAILED DESCRIPTION

Figure 1C:
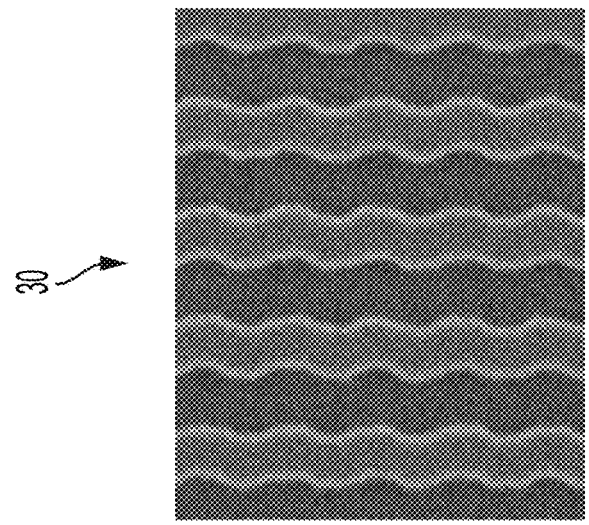
FIG. 1C depicts a SEM micrograph of a periodic grating structure with line edge roughness (LER)

Optical scatterometry, also known as optical critical dimension (OCD), is an inline, fast, and non-destructive model-based technique used primarily for dimensional metrology in both development and high-volume manufacturing. For extreme ultraviolet (EUV) photoresist structures implemented at the 7 nm technology node, fast, accurate metrology and process control of line edge roughness (LER) and line width roughness (LWR) is needed. Further, large area variations across the wafer need to be monitored due to the shrinking pattern dimension. For example, nanoscale LER and LWR have a significant impact on transistor performance and on the performance and reliability of advanced interconnects. Specifically, the roughness on the sidewall of a dielectric feature of a back end of line (BEOL) structure will transfer to a copper interconnect at the interface. As a result, the copper conductivity can be adversely affected because of the enhanced electron scattering. Existing in-line metrology techniques for assessment of LER and LWR do not provide the necessary fast, high throughput methodology needed to extract the desired parameters, which can impact, for example, a transistor performance and performance and reliability of advanced interconnects.

Equations (1) and (2) represent metrics reported by industry standard tools for LER and LWR metrology. A major drawback of these metrics is their inability to quantify spatial distribution of roughness. Apart from spatial distribution, these metrics have reduced relevance through downstream pattern transfer processes which represents a challenge for metrology and accuracy of process assumptions. Apart from σ, which represents root mean square (RMS) of a line edge or line width variation along a single dimension, other relevant parameters to characterize roughness include correlation length (ξ) and roughness exponent (α). Correlation length (ξ) represents roughness measurement segment length beyond which average RMS value is independent of any change in segment length. Roughness exponent (α) quantifies the relative contribution of high frequency component to RMS roughness.

$$\sigma LER = \sqrt{\frac{1}{N}\sum_{i=1}^{N}\left(x_i - \overline{x}\right)^2} \quad (1)$$

$$\overline{x} = \frac{1}{N}\sum_{i=1}^{N} x_i$$

$$\sigma LWR = \sqrt{\frac{1}{N}\sum_{i=1}^{N}(\omega_i - \overline{\omega})^2} \quad (2)$$

$$\omega_i = x_i^L - x_i^R$$

$$\overline{\omega} = \frac{1}{N}\sum_{i=1}^{N}\omega_i$$

Turning now to an overview of the aspects of the invention, embodiments of the invention address the above-described shortcomings of the prior art by providing a method that utilizes OCD models with and without a virtual material (VM) that represents LER/LWR to extract optical roughness with improved computational efficiency. When the OCD models with VM are utilized correlation factors between model parameters such as critical dimensions (CD), sidewall angle (SWA), LWR, LER, thickness, and material properties are removed. Improved accuracy and better matching with CD-SEM characterization are observed. As will be discussed in greater detail below, the method for determining LER/LWR includes a combination of three dimensional (3D) and two-dimensional (2D) models with and without VM to extract the LER, LWR and CD information.

Figure 1B:
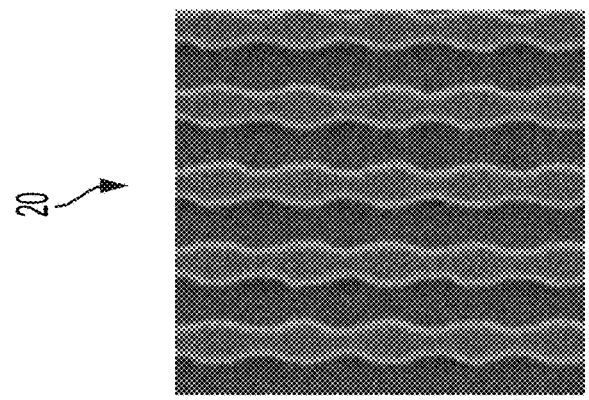
FIG. 1B depicts a SEM micrograph of a periodic grating structure with line width roughness (LWR)
Figure 1A:
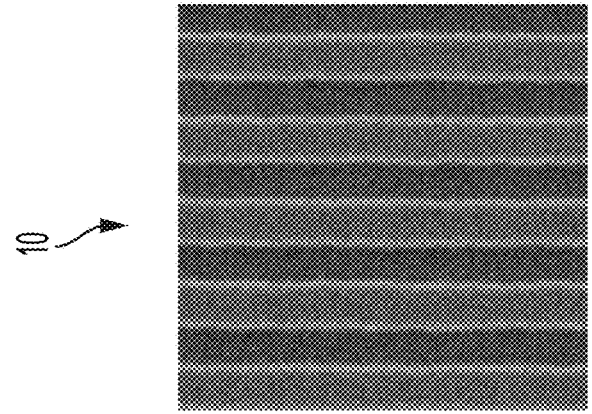
FIG. 1A depicts a scanning electron microscope (SEM) micrograph of a periodic grating structure with no roughness.

FIGS. 1A to 1C illustrate LER/LWR patterns on wafers with high resolution EUV resist coated on a stack consisting of a silicon-containing hard mask and an organic underlayer to facilitate pattern transfer. More specifically, FIG. 1A illustrates a scanning electron microscope (SEM) micrograph of a periodic grating structure 10 fabricated on an EUV mask and patterned on a wafer for metrology analysis that has no roughness. FIG. 1B illustrates a SEM micrograph of a periodic grating structure 20 showing LWR. FIG. 1C illustrates a SEM micrograph of a periodic grating structure 30 showing LER.

Figure 2:
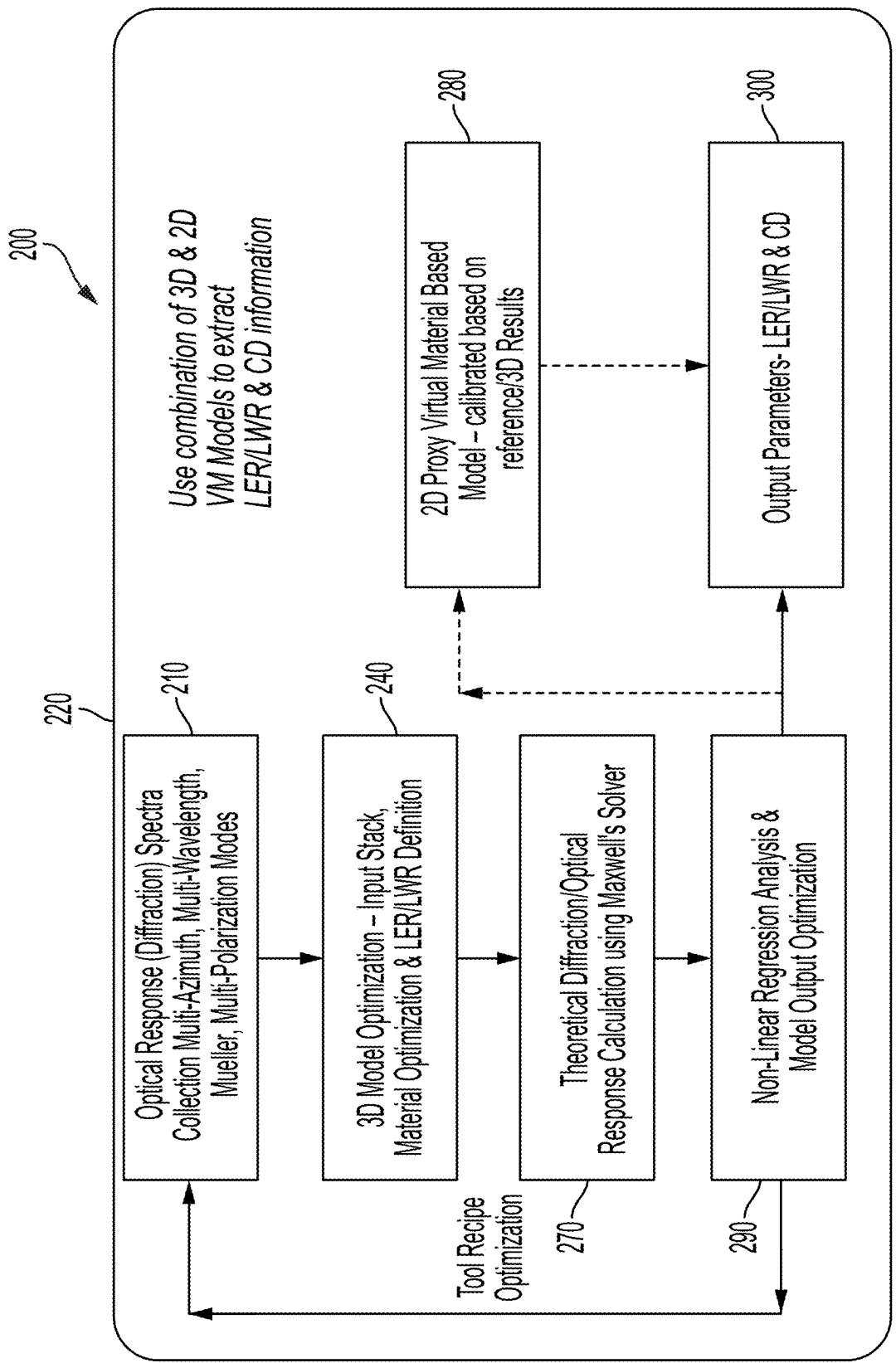
FIG. 2 depicts a flow diagram illustrating a method for extracting output parameters of a semiconductor pattern structure according to embodiments of the present invention.

FIG. 2 is a flow diagram illustrating a method 200 to extract output parameters (i.e. LER, LWR and CD) of a semiconductor pattern structure (not shown), which can impact, for example, a transistor performance and performance and reliability of advanced interconnects. The semiconductor pattern structure can be a semiconductor device having a 7 nanometers and below technology node.

Figure 3B:
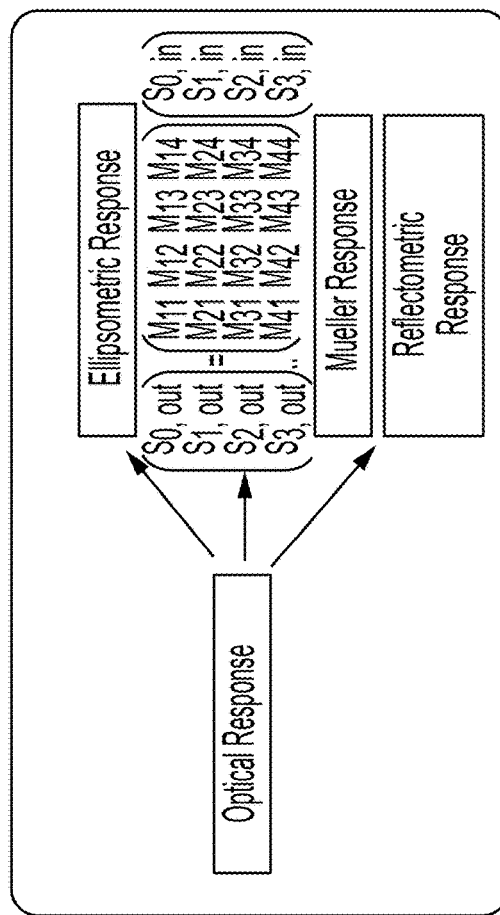
FIG. 3B illustrates examples of optical responses that can be obtained from a reflected light from patterned structures according to embodiments of the present invention.
Figure 3A:
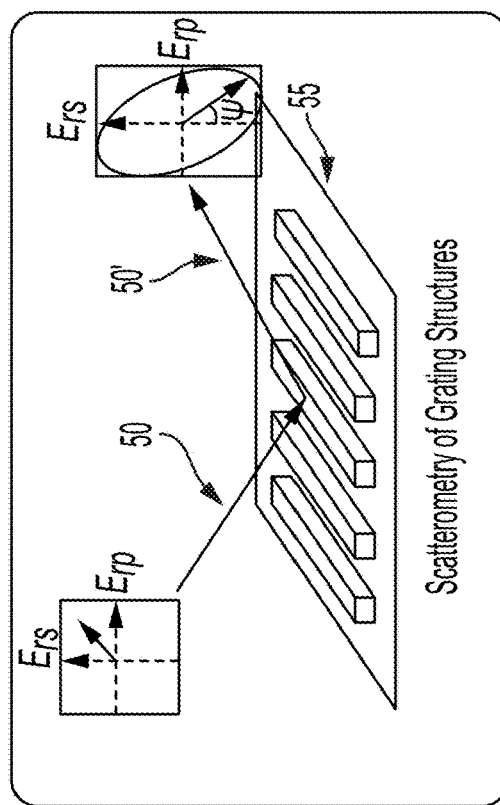
FIG. 3A illustrates an optical metrology setup according to embodiments of the present invention.

Embodiments of the present invention implement the features of the method 200 in computer systems or a computer program product (not show). The computer program product may include a computer readable storage medium having computer readable program instructions thereon for causing a processor to carry out aspects of the method 200. A block 210 shows collecting optical responses (i.e. diffraction) spectra from the semiconductor pattern structure by an optical metrology tool, for example, an optical scatterometer. Optical responses vary with tool optics and largely fall under three categories—reflectometry, ellipsometry and Mueller Polarimetry. FIG. 3A shows an illustration of an optical metrology setup where linearly polarized light beam 50 incident on a grating is modified to elliptically polarized light beam 50'. Ellipsometry is based on the change in polarization that occurs when a beam of polarized light 50 is reflected from a medium 55. The change in polarization includes a phase change and an amplitude change. The change in polarization is different for the portion of the incident radiation with the electric vector oscillating in the plane of incidence, and the portion of the incident radiation with the electric vector oscillating perpendicular to the plane of incidence. Ellipsometry measures the results of these two changes which are conveniently represented by an angle Δ, which is the change in phase of a reflected beam 50'ρ from the incident beam 50; and an angle ψ, which is defined as the arctangent of the amplitude ratio of the incident beam 50 and reflected beam 50', i.e., $$\rho = \frac{r_p}{r_s} = \tan(\Psi)e^{j(\Delta)},$$

where $r_p$ is the p-component of the reflectance, and $r_s$ is the s-component of the reflectance. The angle of incidence and reflection are equal, but opposite in sign, to each other and can be chosen for convenience. Because the reflected beam 50' is fixed in position relative to the incident beam 50, ellipsometry is a convenient technique for in-situ control of processes.

The optical response from the semiconductor pattern structure can be then represented using a Mueller Matrix and Stokes vectors. The Stokes Vector consists of the I, Q, U and V coordinates, respectively representing the mean intensities of the four different polarization states. Any medium can then be represented by a real matrix in 4×4 dimensions which describes the couplings in intensity of the different polarization modes of the light, these couplings being provoked by the interaction of the light with the medium. The Mueller Matrix includes sixteen coefficients which are generally independent of each other. FIG. 3B shows examples of optical responses that can be obtained from a reflected light from patterned structures.

According to embodiments of the present invention, an optical scatterometer can be used to collect optical responses spectra from the semiconductor pattern structure. The optical responses spectra are collected from multiple polarization and wavelength ranges, as well as multiple azimuth angles.

Referring once again to FIG. 2, a block 240 illustrates the development of optical critical dimension (OCD) models, i.e., hypothetical profiles of the semiconductor pattern structure, by using a set of input parameters for each layer of the semiconductor pattern structure. The models can be generated by varying the set of input parameters to generate the OCD models (hypothetical profiles) of varying shapes and dimensions. According to embodiments of the present invention multiple 3D models and 2D models of the semiconductor pattern structure can be generated.

The input parameters for the OCD models of the semiconductor pattern structure can include optical properties, such as absorption coefficient (k) and refractive index (n). Determining the refractive index, n, and the absorptance (absorption coefficient), k, of a coating are two important optical properties. Generally, the polarization does not respond instantaneously to an applied field. This causes dielectric loss, which can be expressed by the complex index of refraction that can be defined as:

$$n=n+ik$$

where: n is the complex refractive index, i is the square root of −1, n is the refractive index, and k is the absorption index. Here, k indicates the amount of absorption loss when the electromagnetic wave propagates through the material. The term k is often called the extinction coefficient in physics. Both n and k are dependent on the wavelength. In most circumstances k>0, i.e., light is absorbed. To calculate k and n of the wafer structure, k and n are collected from a thin blanket layer of known thickness of the same material as used in the semiconductor pattern structure that is formed on top of a bulk silicon.

In addition, structural physical dimensions of the semiconductor pattern structure, such as height and width are determined and included in the input parameters for the OCD models. The structural physical dimensions parameters can also include, for example, a top width and bottom width. The width of the semiconductor pattern structure can be referred to as CD.

The input parameters of the OCD models also include symmetric and asymmetric LER/LWR. Two different versions of the OCD models can be defined and optimized to obtain the best possible regression fits to the measured optical responses spectra with respect to LER and LWR. According to embodiments of the present invention, a 3D model with non-VM and a 3D model with VM have been constructed. FIGS. 4A to 4C illustrates the 3D models A, B, and C according to embodiments of the present invention that represent roughness on periodic patterns and allow to determine LER, LWR and CD of the semiconductor pattern structure. The 3D model with no VM—includes input parameters for all layers of the semiconductor pattern structure. In other words, additional hypothetical inputs (i.e., VM) are not used to define the effect of LER and LWR on the optical response spectra. On the other hand, in order to account for the effect of LER and LWR, the 3D models illustrated in FIGS. 4A to 4C have been constructed that include VM. VM can be defined in variety of ways, including physical representations in the model that can alter the collected LER, LWR and CD of the semiconductor pattern structure. The 3D models with VM allow to reduce correlation between the input parameters, such as LER, LWR, SWA, thickness and the like.

More specifically, FIG. 4A illustrates the 3D model without VM showing uniform underlayer to represent overall roughness in the periodic patterns of the semiconductor pattern structure without additional degree of freedom to define the effect of LER/LWR on the optical response spectra. In other words, FIG. 4A illustrates a basic model that includes hypothetical input parameters for each layer of the semiconductor pattern structure. More specifically, FIG. 4A shows the 3D model without VM having a substrate 400 and a semiconductor model structure 430.

FIGS. 4B and 4C illustrate the 3D models, "B" and "C" with VM that represent roughness around line structures of the semiconductor pattern structure. More specifically, FIG. 4B shows a hard mask layer 450 around the semiconductor model structure 430. FIG. 4C illustrates an EUV resist layer 470 over the hard mask layer 450.

Further, FIG. 4D illustrates the 3D model "D" that shows a spatial distribution 490 of roughness between the line structures of the semiconductor pattern structure.

FIG. 4E illustrates a side view of a 3D segmented LER and LWR model "E". More specifically, FIG. 4E shows a EUV resist layer 470' being segmented. FIG. 4F illustrates the top view of the segmented EUV layer 470' of the 3D segmented LER and LWR model illustrated in FIG. 4E.

Turning once again to FIG. 2, a block 270 illustrates calculating a theoretical optical (diffraction) response from a theoretical input (i.e., data) generated by the OCD models described in the block 240, such as the 3D models with VM to represent roughness. Stimulated diffraction spectra from the OCD models (as shown in the block 240) is generated to be compared to the collected optical responses spectra from the semiconductor pattern structure (as shown in the block 210). According to embodiments of the present invention, the simulated diffraction spectra can be generated by applying, for example, a Maxwell's solver to the theoretical input (i.e., data) generated by the OCD models as illustrated in the block 240 and using a numerical analysis technique to solve Maxwell's equations. For example, coupled-wave analysis (RCWA) is used. It should be noted, however, that various numerical analysis techniques, including variations of RCWA, can be used. In general, RCWA involves dividing a profile into a number of sections, slices, or slabs (hereafter simply referred to as sections). For each section of the profile, a system of coupled differential equations is generated using a Fourier expansion of Maxwell's equations (i.e., the components of the electromagnetic field and permittivity (c)). The system of differential equations is then solved using a diagonalization procedure that involves eigenvalue and eigenvector decomposition (i.e., Eigen-decomposition) of the characteristic matrix of the related differential equation system. Finally, the solutions for each section of the profile are coupled using a recursive-coupling schema, such as a scattering matrix approach.

A block 290, shown in FIG. 2, illustrates non-linear regression analysis and model output optimization to determine output parameters, such as LWR/LWR and CD, of the semiconductor pattern structure. According to embodiments of the present invention, the measured optical responses spectra from the semiconductor pattern structure described in the block 210 is compared to the theoretical optical response of the block 270 calculated by using, for example, a Maxwell solver from theoretical input generated by the OCD models (as shown in the block 240).

More specifically, when a match is made between the measured optical responses spectra and the theoretical optical response of the block 270 or when the difference of the measured optical responses spectra of the block 210 and one of the theoretical optical response of the block 270 is within a preset or matching criterion, the matching theoretical optical response is presumed to represent an output profile of the semiconductor pattern structure, i.e., output parameters for LER/LWR and CD as illustrated by a block 300. In other words, the theoretical optical response can be used to determine whether the semiconductor pattern structure has been fabricated in accordance with preset parameters. To the contrary, if a match is not made between the measured optical responses spectra and the theoretical optical response of the block 270 or when the difference of the measured optical responses spectra of the block 210 and one of the theoretical optical response of the block 270 is not within a preset or matching criterion, then another theoretical optical response can be generated. Alternatively, new optical responses spectra for the semiconductor pattern structure, as illustrated in the block 210, can be collected to allow for new regression analysis as shown by an arrow 220.

A block 280, shown in FIG. 2, illustrates the development of 2D models with VM to determine LER/LWR through theoretical input (data) generated based on the 2D models with improved computational efficiency. The 2D models are efficient and quick approach to get reasonable accuracy for determining LER/LWR. The 2D models can also be used as the basis to optimize the 3D model described in the block 240.

Figure 5A:
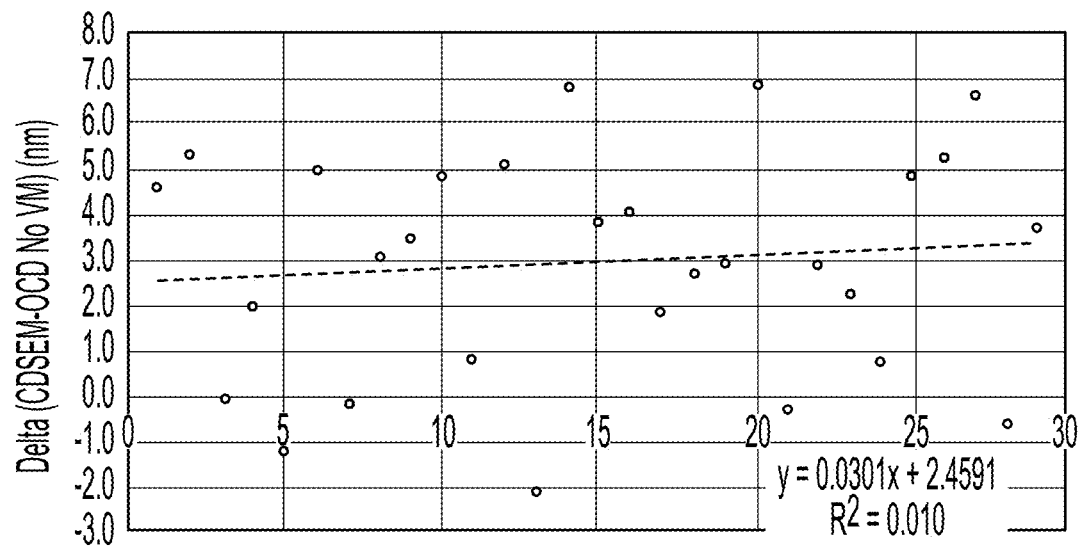
FIG. 5A illustrates a graphical representation of critical dimensions (CD) comparison of optical measurements using 3D models without virtual material (VM) according to embodiments of the present invention and CD-SEM measurements.
Figure 5B:
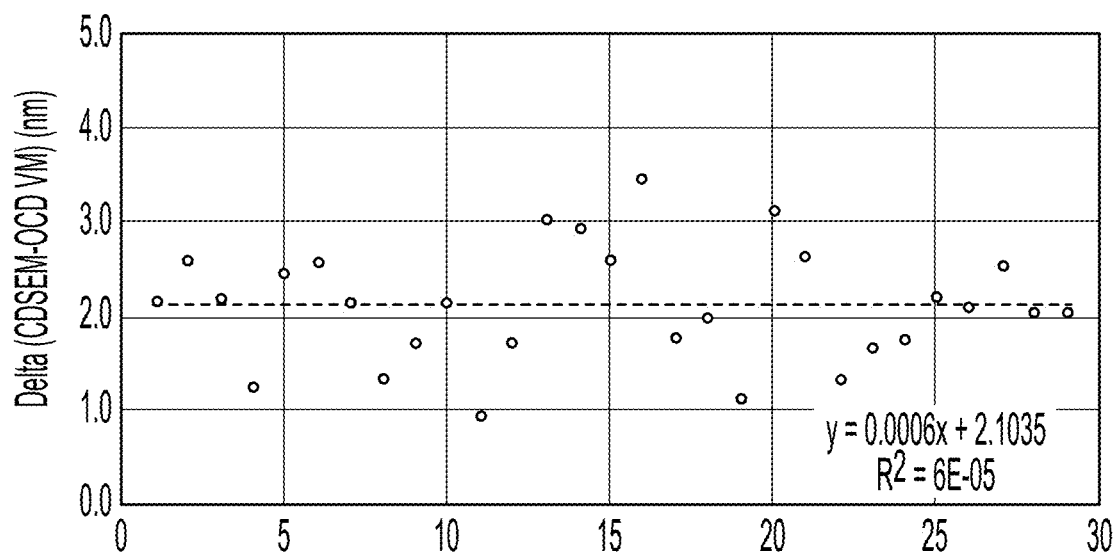
FIG. 5B illustrates a graphical representation of CD comparison of optical measurements using 3D models with VM to represent roughness according to embodiments of the present invention and CD-SEM measurements.

The usage of a VM to estimate LEW and LWR provides two parameters, the CD of the semiconductor pattern structure and a value that corresponds to the roughness. FIGS. 5A and 5B show a comparative assessment of critical dimension measurements with and without the use of the VM in the OCD model against measurements obtained from CD-SEM. The difference in the slope and the coefficient of determination for the OCD model with the VM indicates better estimation through multiple programmed roughness structures. Each data point in FIGS. 5A and 5B represent a unique programmed roughness structure. More specifically, FIG. 5A illustrates a graphical representation of CD comparison of optical measurements using 3D models without VM to represent roughness according to embodiments of the present invention and CD-SEM measurements. FIG. 5B illustrates a graphical representation of CD comparison of optical measurements using 3D models with VM to represent roughness according to embodiments of the present invention and CD-SEM measurements. Improved accuracy and better matching with the CD-SEM results is shown by using the 3D models with VM to represent roughness according to embodiments of the present invention.

Detailed embodiments include methods for determining LWR and LER in EUV semiconductor patterns using optical metrology according to aspects of the present invention have been described herein. However, it is to be understood that the embodiments of the invention described herein are merely illustrative of the structures that can be embodied in various forms. In addition, each of the examples given in connection with the various embodiments of the invention is intended to be illustrative, and not restrictive. Further, the figures are not necessarily to scale, some features can be exaggerated to show details of particular components. Therefore, specific structural and functional details described herein are not to be interpreted as limiting, but merely as a representative basis for teaching one skilled in the art to variously employ the methods and structures of the present description. For the purposes of the description hereinafter, the terms "upper", "lower", "top", "bottom", "left," and "right," and derivatives thereof shall relate to the described structures, as they are oriented in the drawing figures. The same numbers in the various figures can refer to the same structural component or part thereof.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

Conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

It is to be understood that the various layers and/or regions shown in the accompanying drawings are not drawn to scale, and that one or more layers and/or regions of a type commonly used in complementary metal-oxide semiconductor (CMOS) fabrication techniques, fin field-effect transistor (FinFET) devices, metal-oxide-semiconductor field-effect transistor (MOSFET) devices, and/or other semiconductor fabrication techniques and devices, may or may not be explicitly shown in a given drawing. This does not imply that the layers and/or regions not explicitly shown are omitted from the actual devices. In addition, certain elements could be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present invention can be employed in applications, hardware, and/or electronic systems. Suitable hardware and systems for implementing embodiments of the invention can include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that could require, for example, CMOSs, MOSFETs, and/or FinFETs. By way of non-limiting example, the semiconductor devices can include, but are not limited to CMOS, MOSFET, and FinFET devices, and/or semiconductor devices that use CMOS, MOSFET, and/or FinFET technology.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It will also be understood that when an element, such as a layer, region, or substrate is referred to as being "on" or "over" another element, it can be directly on the other element or intervening elements can also be present. In contrast, when an element is referred to as being "directly on" or "directly over" another element, there are no intervening elements present, and the element is in contact with another element.

As used herein, the term "substrate" can include a semiconductor wafer, such as a type IV semiconductor wafer, e.g., silicon wafer, or a type III-V semiconductor wafer, such as a compound semiconductor, e.g., gallium arsenide semiconductor wafer. In one or more embodiments, a number of dielectric layers and semiconductor material layers can be arranged with the substrate to provide microelectronic devices, or smaller devices, which can include semiconductor devices, such as field effect transistors (FETs), fin type field effect transistors (FinFETs), bipolar junction transistors (BJT) and combinations thereof. The at least one device layer can also include memory devices, such as dynamic random access memory (DRAM), embedded dynamic random access memory (EDRAM), flash memory and combinations thereof. The at least one device layer can also include passive devices, such as resistors and capacitors, as well as electrical connections to the devices containing within the at least one device layer.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments of the invention described. Many modifications and variations will be apparent to those of ordinary skill in the art without departing from the scope and spirit of the described embodiments of the invention. The terminology used herein was chosen to best explain the principles of the embodiments of the invention, the practical application or technical improvement over technologies found in the marketplace, or to enable others of ordinary skill in the art to understand the embodiments of the invention described herein.

What is claimed is:

1. A system for determining optical roughness in a semiconductor pattern structure, the system comprising:
    an optical metrology tool; and
    one or more processors for executing computer readable instructions, the computer readable instructions controlling the one or more processors to perform operations comprising:
        receiving optical response spectra collected from a semiconductor pattern structure by the optical metrology tool;
        constructing optical critical dimension (OCD) models by using a set of input parameters for each layer of the semiconductor pattern structure, wherein the OCD models comprise three dimensional (3D) models comprising a virtual material, the virtual material comprising a hard mask layer and an extreme ultraviolet (EUV) resist layer;
        calculating theoretical optical responses from a theoretical input generated by the OCD models; and
        comparing the optical response spectra of the semiconductor pattern structure to the theoretical optical responses to determine output parameters for the optical roughness in the semiconductor pattern structure.

2. The system of claim 1, wherein the optical roughness comprises a line width roughness (LWR) and a line edge roughness (LER).

3. The system of claim 1, wherein the set of input parameters comprise optical parameters and structural physical dimensions of the semiconductor pattern structure.

4. The system of claim 1, wherein the OCD models comprise three dimensional (3D) models and two dimensional (2D) models.

5. The system of claim 1, wherein the virtual material represents roughness.

6. The system of claim 1, wherein the semiconductor pattern structure comprises a semiconductor device at a 7 nanometers and below technology node.

7. The system of claim 1, wherein the optical metrology tool comprises an optical scatterometer.

8. A system for determining line edge roughness (LER) and line width roughness (LWR) in a semiconductor pattern structure, the system comprising:
    an optical metrology tool; and
    one or more processors for executing computer readable instructions, the computer readable instructions controlling the one or more processors to perform operations comprising:
        receiving optical response collected spectra from the semiconductor pattern structure by the optical metrology tool;
        constructing optical critical dimension (OCD) models with a virtual material (VM), wherein the VM represents the LER and/or the LWR, wherein the OCD models comprise a hard mask layer and an extreme ultraviolet (EUV) resist layer;
        calculating theoretical optical responses from a theoretical input generated by the OCD models with the VM; and
        comparing the optical response spectra of the semiconductor pattern structure to the theoretical optical responses to determine output parameters for the LER and the LWR in of the semiconductor pattern structure.

9. The system of claim 8, wherein the OCD models with the VM comprise three dimensional (3D) models.

10. The system of claim 8, wherein the OCD models with the VM comprise two dimensional (2D) models.

11. The system of claim 8 further comprising:
constructing the OCD models without the VM.

12. The system of claim 8, wherein the OCD models use a set of input parameters for each layer of the semiconductor pattern structure.

13. The system of claim 12, wherein the set of input parameters comprise optical parameters and structural physical dimensions of the semiconductor pattern structure.

14. The system of claim 8, wherein the semiconductor pattern structure comprises a semiconductor device at a 7 nanometers and below technology node.

15. The system of claim 8, wherein the optical metrology tool comprises an optical scatterometer.

16. The system of claim 8, wherein the optical response spectra are collected from multiple polarization ranges, multiple wavelength ranges and multiple azimuth angles.

17. A computer program product comprising a non-transitory computer readable storage medium having program instructions embodied therewith, the program instructions executable by one or more processors to cause the one or more processors to perform operations comprising:

receiving optical response spectra collected from a semiconductor pattern structure by an optical metrology tool;

constructing optical critical dimension (OCD) models by using a set of input parameters for each layer of the semiconductor pattern structure, wherein the OCD models comprise three dimensional (3D) models comprising a virtual material, the virtual material comprising a hard mask layer and an extreme ultraviolet (EUV) resist layer;

calculating theoretical optical responses from a theoretical input generated by the OCD models; and comparing the optical response spectra of the semiconductor pattern structure to the theoretical optical responses to determine output parameters for an optical roughness of the semiconductor pattern structure.

18. The computer program product of claim 17, wherein the optical roughness comprises a line width roughness (LWR) and a line edge roughness (LER).

19. The computer program product of claim 17, wherein the set of input parameters comprise optical parameters and structural physical dimensions of the semiconductor pattern structure.

20. The computer program product of claim 17, wherein the OCD models comprise three dimensional (3D) models and two dimensional (2D) models.

* * * * *